United States Patent [19]

Cipolla et al.

[11] Patent Number: 5,771,559
[45] Date of Patent: Jun. 30, 1998

[54] REMOVABLE HEAT SINK ASSEMBLY PROCESS FOR A CHIP PACKAGE

[75] Inventors: Thomas Mario Cipolla, Katonah; Paul William Coteus, Yorktown Heights, both of N.Y.

[73] Assignee: International Business Machines Corporation, Armonk, N.Y.

[21] Appl. No.: 642,251

[22] Filed: May 2, 1996

Related U.S. Application Data

[62] Division of Ser. No. 405,069, Mar. 16, 1995, Pat. No. 5,586,005.

[51] Int. Cl.$^6$ ................................................. B23P 11/02
[52] U.S. Cl. ........................................................... 29/453
[58] Field of Search ............................... 29/453; 24/297, 24/453; 411/907, 508; 257/719; 248/509; 361/704, 719, 809

[56] References Cited

U.S. PATENT DOCUMENTS

| 3,651,545 | 3/1972 | Hara ........................................ 24/73 P |
| 3,688,635 | 9/1972 | Fegen ........................................ 85/5 R |
| 4,224,663 | 9/1980 | Maiese et al. ........................... 363/144 |
| 4,297,769 | 11/1981 | Coules .................................. 174/138 D |
| 4,604,776 | 8/1986 | Takahashi ................................. 24/453 |
| 4,701,984 | 10/1987 | Wyckoff .................................... 24/573 |
| 4,760,495 | 7/1988 | Till ......................................... 361/412 |
| 4,901,204 | 2/1990 | Hayashi ................................... 361/417 |
| 5,010,949 | 4/1991 | Dehaine ..................................... 165/76 |
| 5,089,936 | 2/1992 | Kojima et al. ........................... 361/387 |
| 5,118,903 | 6/1992 | Schupp et al. .......................... 174/16.3 |
| 5,132,875 | 7/1992 | Plesinger ................................. 361/704 |
| 5,208,731 | 5/1993 | Blomquist ............................... 361/386 |
| 5,276,585 | 1/1994 | Smithers ................................. 361/704 |
| 5,305,185 | 4/1994 | Samarov et al. ....................... 361/704 |
| 5,307,239 | 4/1994 | McCarty et al. ....................... 361/704 |
| 5,329,426 | 7/1994 | Villani .................................... 361/719 |
| 5,384,940 | 1/1995 | Soule ....................................... 24/453 |

FOREIGN PATENT DOCUMENTS

| 5160588A | 6/1993 | Japan ..................................... 361/719 |
| 776746 | 6/1957 | United Kingdom ............... 174/138 D |
| 1541448 | 6/1975 | United Kingdom ............... 174/138 D |

*Primary Examiner*—David P. Bryant
*Attorney, Agent, or Firm*—Daniel P. Morris; Alvin J. Riddles

[57] ABSTRACT

The process of the invention employs a post type fastening member that provides, at one end, an insertion friction connection to the circuit card and at the other end, extending through the heat sink, a compression spring means that urges the heat sink toward the cirduit card. A plurality of the post type fasteners are positioned around the periphery of the chip package to retain the heat sink parallel to the circuit card and compressing the chip package. The packaging structure of the invention permits larger area heat sinks than the chip package area to be supported by the circuit card with the only relationship with the chip being that of a compression thermal transfer contact and radiation shield.

8 Claims, 2 Drawing Sheets

REMOVABLE HEAT SINK ASSEMBLY PROCESS FOR A CHIP PACKAGE

This is a divisional application of Ser. No. 08/405,069, filed Mar. 16, 1995, now U.S. Pat. No. 5,586,005.

FIELD OF THE INVENTION

The invention relates generally to the packaging of electronic components in electronic apparatus and in particular to the removable attachment of a heat dissipating member to an integrated circuit chip package mounted on and connected into an electronic apparatus.

BACKGROUND OF THE INVENTION AND RELATION TO THE PRIOR ART

As the packaging of electronic apparatus continues to downsize a number of factors are affecting the ability to position integrated chip packages on circuit cards, to dissipate the heat produced by the integrated circuit chip or chips in the package and to structurally support heat dissipation apparatus so as to prevent excessive forces from being applied to the chip package.

A trend is developing in the art to employ heavy finned heat sinks the size of the chip package that are removably attached with spring pressure to chip package socket members. Such structures are illustrated in U.S. Pat. Nos. 5,329, 426; 5,307,239; 5,276,585 and 5,208,731.

As the art is progressing the integrated circuit package is being constructed as a high density double faced package unit with closely spaced electrical contacts on one face that is positioned in contact with the wiring on a supporting member such as a circuit card and with the other face of the chip package that is to be away from the circuit card available for heat transfer.

It is becoming essential in the packaging of modern high speed electronic apparatus that there be the capability of mounting the chip packages on the circuit cards very close together with accommodation for other components being on the circuit cards adjacent to the chip packages; that heat dissipating apparatus, such as a finned heat sink member, may have an area larger than the chip package area; that the heat sink may be compressed against the chip package permitting accommodation of differences in expansion while not transferring forces supporting the heat sink to the chip package; and that the heat sink be removable independent of the chip for repair and chip repopulating of the electronic apparatus.

SUMMARY OF THE INVENTION

The invention employs a post type fastening member that provides, at one end, an insertion friction connection to the circuit card and at the other end, extending through the heat sink, a compression spring means that urges the heat sink toward the circuit card. A plurality of the post type fasteners are positioned around the periphery of the chip package to retain the heat sink parallel to the circuit card and compressing the chip package. The packaging structure of the invention permits larger area heat sinks than the chip package area to be supported by the circuit card with the only relationship with the chip package being that of thermal transfer and radiation shield.

DESCRIPTION OF THE INVENTION

The invention positions a heat sink member, that can be larger than a chip package, in removable compression contact with the chip package, through a post type fastening member arrangement, that holds the heat sink under compression against the chip package and with all other forces being accommodated by the post type fasteners. Each post type fastening member in the packaging arrangement is equipped on one end for friction retention in a hole in the circuit card and on the opposite end with spring compressing means for urging a heat sink against the chip package in the direction of the circuit card.

Figure 1:
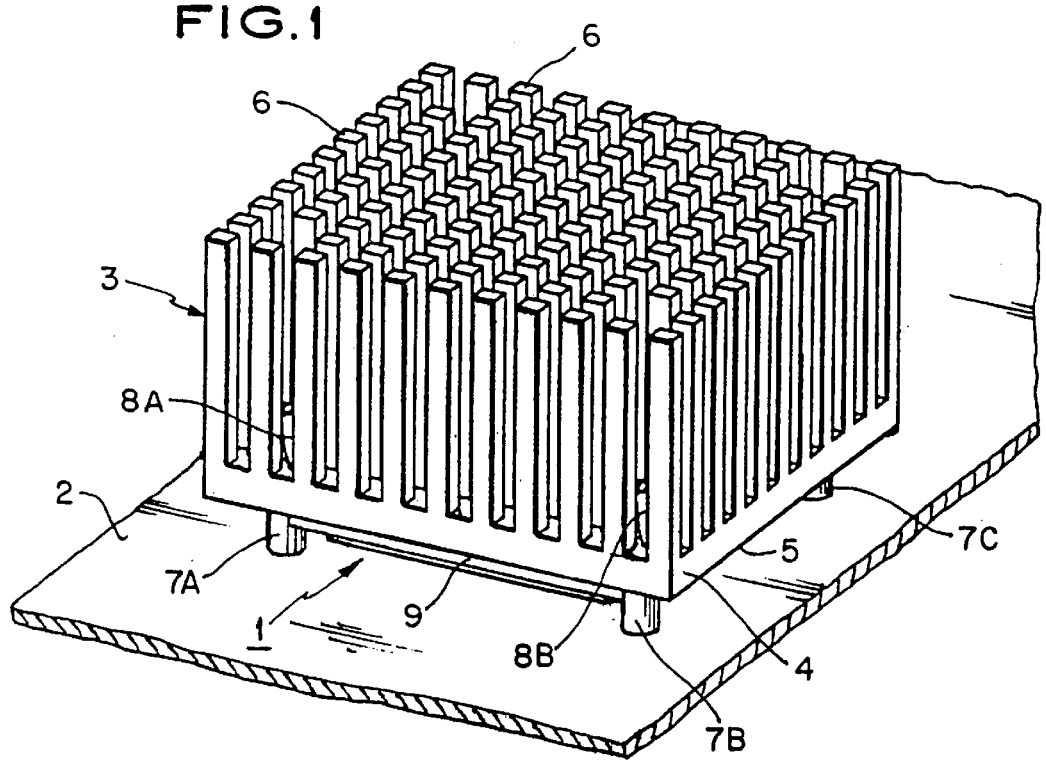
FIG. 1 is a perspective view of the removable heat sink packaging assembly of the invention.

Referring to FIG. 1 there is shown a perspective view of the removable heat sink packaging assembly of the invention, wherein a chip package 1, having essentially parallel contact and thermal transfer faces, not visible in this view, is positioned on a circuit card 2 with the circuitry interconnections out of view in the interface between the chip package 1 and the surface of the circuit card 2. A heat sink 3, shown as the pin fin type used in the art, has a contacting planar portion 4, having a thermal transfer face 5 in contact with the thermal transfer face of the chip package 1, and having a plurality of radiation extending members 6 such as pin fins, as shown, or other fin like structural members, extending into the ambient from the remaining surface of the planar portion 4.

In accordance with the invention, the heat sink 3 is supported by a plurality of post type fastening members 7 each of which provides, at one end, an insertion friction connection to the circuit card, not visible in this figure, and at the other end, extending through the planar portion 4 of the heat sink 3, a compression spring means 8 that urges the heat sink 3 toward the circuit card 2. The heat sink 3 is supported by a plurality of at least three post type fasteners 7 that maintain the planar portion 4 of the heat sink 3 essentially parallel to the circuit card 2. In the perspective view of FIG. 1 there are four post type fastening members, of which three 7A,7B and 7C, and spring means 8A and 8B, are visible, in positions around the periphery of the chip package and operate to retain the planar portion 4 of the heat sink 3 parallel to the circuit card 2 and provide a compression force between the heat sink 3 and the chip package 1. In a preferred embodiment, the post type fasteners 7A–7D are positioned in a frame 9 which provides shock resistance in a variety of directions and alignment assistance in assembly and disassembly.

Figure 2:
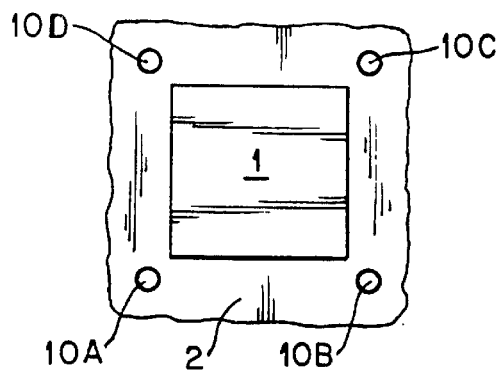
FIG. 2 is a top view of a chip package on a circuit card with post type fastening member insertion holes.

Referring next to FIG. 2 there is shown a top view of a chip package positioned on a portion of a circuit card with peripheral post type fastening member insertion holes and wherein the same reference numerals as in FIG. 1 are used where appropriate. In FIG. 2 the insertion holes 10 A–D extending through the circuit card 2 are shown in a square configuration peripherally around the chip package 1. Any pattern, for the configuration of the holes 10 is useable, so long as the post type fastener configuration maintains planar compressive force by the heat sink 3, not visible in this figure, on the thermal transfer face of the chip package 1. The variability of the fastener hole configuration provides some flexibility in accommodation with the wiring pattern of the circuit card.

Figure 3:
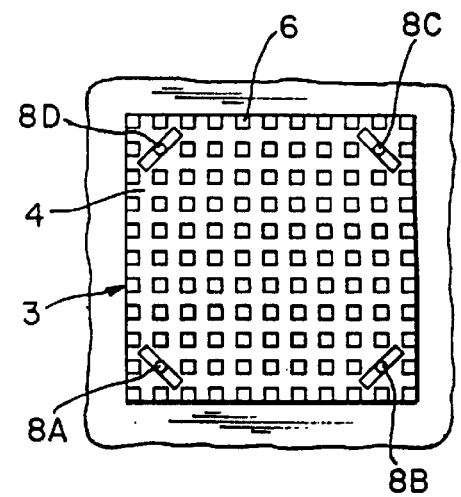
FIG. 3 is a top view showing a pin fin type heat sink retained with the compression spring means of four post type fastening members.

Referring next to FIG. 3 there is shown a top view of the heat sink as in FIG. 1 with the compression spring means of four post type fastening members, wherein the same reference numerals as in the previous figures are used where appropriate. In FIG. 3 the compression spring means portions 8A–D of the post type fastening members 7 A–D extend through clearance holes, not visible in this figure, in the planar portion 4 of the heat sink 3 with the spring extensions of each providing compressive force on the planar portion 4 toward the thermal transfer surface of the chip package which is in contact with the side 5 of the planar portion 4 of the heat sink 3 also not visible in this figure. The heat sink 3 can radiate energy and where needed can be either made of a conductive material or given a conductive coating. The packaging structure of the invention permits larger area heat sinks than the chip package area to be supported by the circuit card under conditions where the only attachment to the chip is that of a compression thermal transfer contact.

Figure 4:
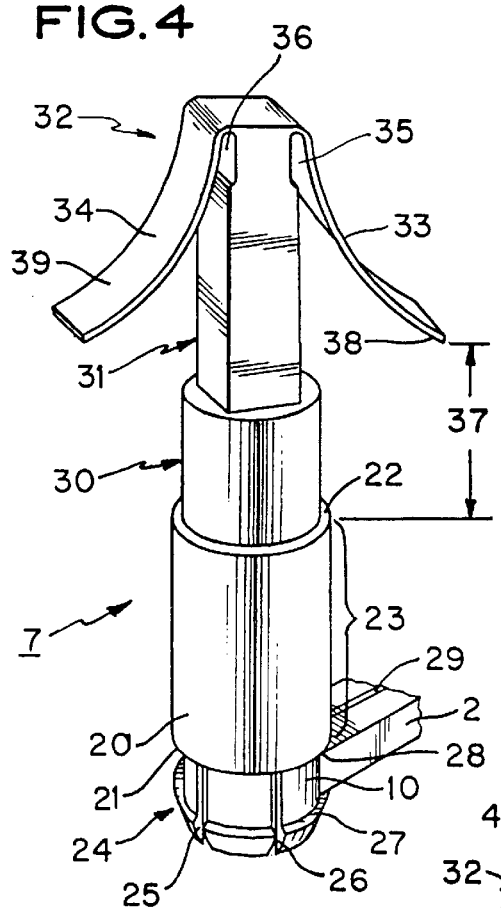
FIG. 4 is a perspective view of a post type fastening member of the invention.

In FIG. 4 there is shown the post type fastening member of the invention using the same reference numerals as in the previous figures where appropriate. Referring to FIGS. 1–4, the post type fastening member 7, has a body portion 20, with a shoulder 21 that in assembly will be in contact with the circuit card 2.

The distance 23 between the shoulders 21 and 22 is slightly less than the height of the chip package to allow for compression in the contact of the heat sink 3 face 5 with the thermal transfer face of the chip package 1. On one end of the post type fastening member 7 there is an engaging portion 24 that in assembly is to extend into the hole 10 of the circuit card 2, be insertable with a force on the member 7 in the direction of the circuit card 2 and retain the member 7 with the shoulder 21 in contact with the face of the circuit card 2. The portion 24 is compressable, is larger than the insertion hole 10 in the circuit card 2 and is retained by a friction fit and mechanical locking in the hole 10. The friction fit is produced by a series of slots of which two, 25 and 26, are shown, which permits the portion 24 to be compressed in the hole 10. The engaging portion 24 has a tapered ridge 27 that is larger than the hole 10, that in position at the portion of the hole 10 at the underside 28 of the circuit card 2, draws the shoulder 21 tight against the surface of the circuit card 2. The taper of the ridge 27 accommodates for variations in thickness of circuit cards. Connection for radiation shielding purposes can conveniently be made by providing a grounded conductor such as 29 on the circuit card 2, contacting the shoulder 21.

The post type fastener 7 has a portion 30 sufficiently smaller in diameter to provide a solid support for the thermal transfer surface 5 of the heat sink 3 and which in the assembly extends through a clearance hole in the planar portion 4 of the heat sink 3.

The post type fastener 7 has a portion 31 that extends beyond the portion 30 and performs the function of supporting a spring means 32 that will provide compressive force in the assembly that urges the heat sink compressively against the thermal transfer surface of the chip package.

The portion 31 has spring finger members 33 and 34, made with reliefs 35 and 36, for freedom of movement, that extend to a dimension 37 between the ends of the spring members 38 and 39 from the shoulder 22 that provides spring deformation in assembly against the planar portion 4 of the heat sink 3 that compresses the heat sink 3 thermal transfer face 5 against the thermal transfer face of the chip package 1. The portion 31 is square to provide clearance for the spring members 33 and 34 to pass through the clearance hole in the planar portion 4 of the heat sink 3 and to facilitate orientation for assembly. The spring members 33 and 34 may be molded as part of the portion 31, and are usually thicker at the base and thinner at the ends 38 and 39. The details of the member cross section, length of the ends 38 and 39 and the material determine the force urging the planar portion 4 of the heat sink 3 toward the chip package 1.

In a specific embodiment, assuming a 32 millimeter square chip package which is to be equipped with a 54 millimeter by 48 millimeter heat sink, supported by four post type fasteners of metallized injection moldable plastic material known in the art as ABS material, as shown in the structures of FIGS. 1–4, each with an insertion portion with a 2.0 mm diameter, positioned into a 1.8 mm diameter hole in a circuit card, a compressive force between the heat sink and the chip package of from 10 to 20 pounds may be produced. A thermal conducting grease may be employed between the thermal transfer faces to enhance thermal conduction.

There are variations in structure that can impart structural strength and assembly flexibility. One such variation is to mount the post type fasteners in a frame that surrounds the chip package. The frame provides support for heavier heat sink structures and alignment advantages in simultaneously getting the portions 24 of a plurality of post type fasteners 7 into holes 10 around a chip package 1 on a circuit card 2. Another variation is to provide the spring portion of the post type fastener as a separate element for attachment after assembly.

Figure 5:
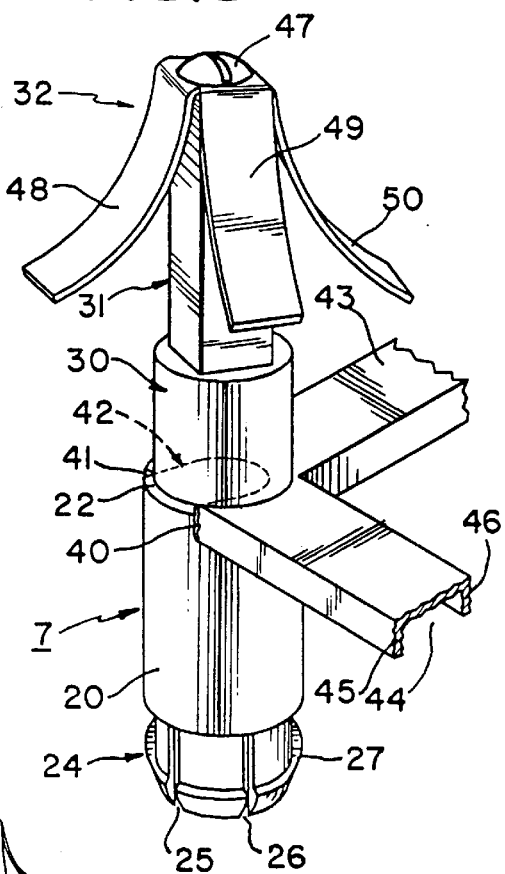
FIG. 5 is a perspective view of a post type fastener-frame embodiment of the invention.

In FIG. 5 there is shown a perspective view of a portion of the post type fastener and frame structure employing the same reference numerals as in previous figures where appropriate.

Referring to FIG. 5 the post type fastener 7 has the portion 20 modified at regions 40 and 41 to fit into a slot 42, shown dotted, in a frame 43, corresponding to element 9 of FIG. 1, that joins into an enclosure a plurality, usually four, post type fasteners around a chip package, not shown. The frame 43 can be of a channel 44 type construction so that only narrow lines 45 and 46 on the circuit card are involved and components on the circuit card can occupy the channel.

Continuing to refer to FIG. 5, the spring means 32 may be made up of a single piece attached to the top of element 31 by a friction fastener 47 and equipped with four spring finger elements 48, 49, 50 and 51, of which three 48–50, are visible in this figure. This type of spring means eases manufacturing and eases assembly from above, when much of the circuit card area is covered with other heat sink structures.

Figure 6:
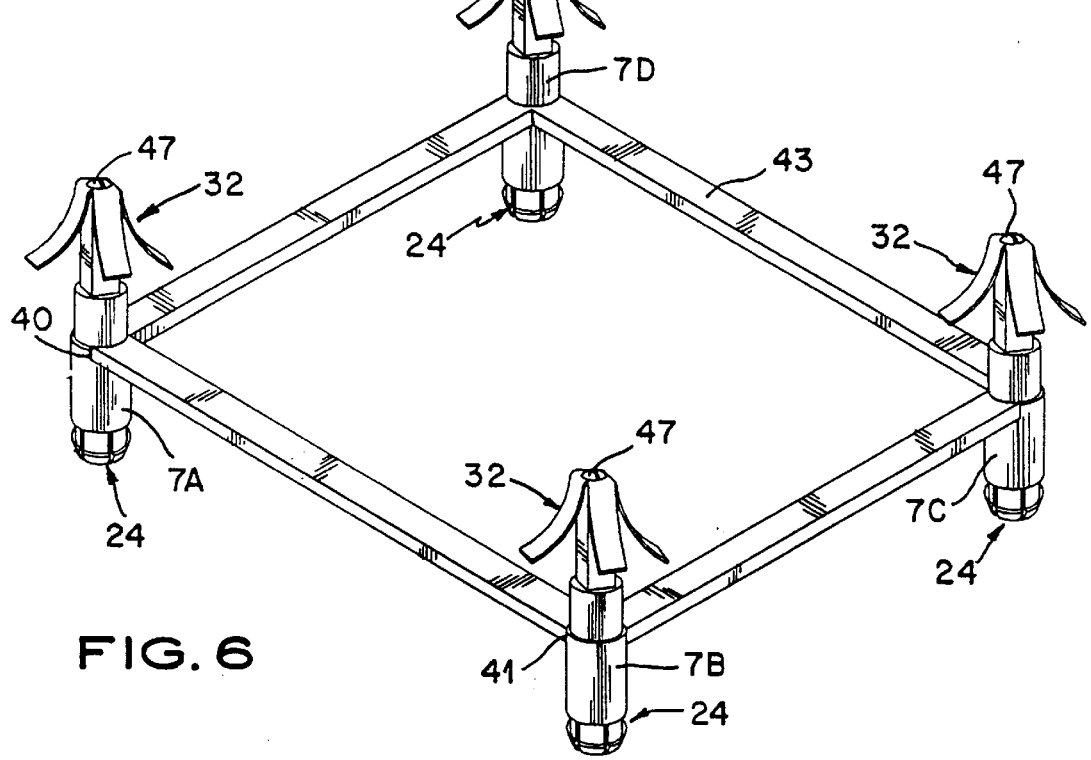
FIG. 6 is a perspective view of a four post type frame embodiment of the invention.

In FIG. 6 a perspective view is provided of a complete frame and four post type fastener assembly, continuing to use the same reference numerals where appropriate. The structure of the figure is illustrative of the assembly, and packing density advantages of the invention. In the structure, heat sinks can extend beyond the frame 43 and post type fasteners 7A–7D in all directions and can touch other heat sinks in all directions. Other components mounted on the circuit card can be positioned adjacent to the sides of the chip package and the heat sink can be assembled last.

What has been described is a removable heat sink structure employing a post type fastening member that provides, at one end, an insertion friction connection to the circuit card and at the other end, extending through the heat sink, a spring means that urges the heat sink toward the circuit card thereby providing a compression contact between the heat sink and the chip package in service. A plurality of the post type fasteners are positioned around the periphery of the chip package to retain the heat sink parallel to the circuit card and compressing the chip package. The packaging structure of the invention permits larger area heat sinks than the chip package area to be supported by the circuit card with the only contact with the chip package being that of a compression thermal transfer contact and radiation shield.

What is claimed is:

1. In an electronic apparatus wherein there is at least one chip package mounted on a circuit card, having circuit connections on one package face connected into the circuitry of said card and having an essentially parallel second package face, separated from said first package face by a height dimension, in contact with a heat sink having first and second faces said first heat sink face being in contact with said second package face, the process of mounting said heat sink in removable compressive contact with said second package face comprising the steps of:

providing said heat sink with a plurality of holes extending from said first heat sink face to said second heat sink face, providing a plurality of post type fastener members each said fastener member having a body with first and second end regions defined by first and second shoulders respectively, said shoulders being separated along the length of said body by a dimension slightly less than said height dimension, each said post type fastener member further having spring means on said first end operable to apply force to said heat sink when positioned in said heat sink in the direction of said first shoulder and each said post type fastener member on said second end having expansion and retention construction features operable to retain said post type fastener member in a hole in said circuit card with said second shoulder in contact with said circuit card, positioning each said post type fastener with said first end region extending to said first shoulder, into a separate one of said holes in said heat sink and, positioning each said post type fastener with said second end region extending to said second shoulder into a separate hole in said circuit card.

2. The process of claim 1 wherein said plurality of post type fasteners is four.

3. The process of claim 2 wherein in each said post type fastener member said spring means is a plurality of spring fingers that fit through a corresponding one of said holes through said heat sink.

4. The process of claim 3 including the step of making each said post type fastener member spring means a separable spring finger unit and attaching the unit to said first end of said fastener member after said fastener member is in position through one of said holes in said heat sink.

5. A process for removably retaining a thermal transfer face of a heat sink in compressive contact with a first, thermal transfer face of a chip package said chip package having a second face separated from said first face by a height dimension and mounted in contact with a circuit card, comprising the steps of:

providing said heat sink with a plurality of holes extending from said heat sink thermal transfer face to a second heat sink face, providing a plurality of post type fastener members each having a body with first and second end regions, said body having a first shoulder at said first end region with an insertion portion extending from said first shoulder, said insertion portion having expansion and retention construction features operable to retain said first end region of said body with said first shoulder in contact with said circuit card in a separate hole in said circuit card, said body having a second shoulder, separated along said body from said first shoulder, by a dimension slightly less than said height dimension of said chip package, said body further having at said second end region, a spring means extending through a separate hole through said heat sink and providing compressive spring force in the region of said heat sink surrounding said hole through said heat sink in the direction of said circuit card, positioning each said post type fastener with said second end region extending to said second shoulder, into a separate one of said holes in said heat sink and, positioning each said post type fastener with said first end region extending to said first shoulder into a separate hole in said circuit card.

6. The process of claim 5 including the step of assembling said plurality of post type fastener members in a frame surrounding said chip package.

7. The process of claim 6 wherein said plurality of post type fastener members is four.

8. The process of claim 7 including the step of making each said post type fastener member spring means a separable spring finger unit and attaching the unit to said second end of said fastener member after said fastener member is in position through one of said holes in said heat sink.

* * * * *